United States Patent
Zu et al.

(10) Patent No.: US 12,407,548 B2
(45) Date of Patent: Sep. 2, 2025

(54) SIGNAL PROCESSING METHOD AND DEVICE FOR A MEMORY SYSTEM INTERFACE CIRCUIT

(71) Applicant: MONTAGE TECHNOLOGY (KUNSHAN) CO., LTD., Jiangsu (CN)

(72) Inventors: Qiuyan Zu, Jiangsu (CN); Chunlai Sun, Jiangsu (CN); Gang Yan, Jiangsu (CN); Yong Wang, Jiangsu (CN); Wuguang Wang, Jiangsu (CN)

(73) Assignee: MONTAGE TECHNOLOGY (KUNSHAN) CO., LTD., Jiangsu (CN)

( * ) Notice: Subject to any disclaimer, the term of this patent is extended or adjusted under 35 U.S.C. 154(b) by 0 days.

(21) Appl. No.: 18/696,350

(22) PCT Filed: Mar. 16, 2023

(86) PCT No.: PCT/CN2023/081920
§ 371 (c)(1),
(2) Date: Mar. 27, 2024

(87) PCT Pub. No.: WO2023/193588
PCT Pub. Date: Oct. 12, 2023

(65) Prior Publication Data
US 2024/0396768 A1   Nov. 28, 2024

(30) Foreign Application Priority Data
Apr. 4, 2022   (CN) .......................... 202210352335.4

(51) Int. Cl.
H04L 25/03 (2006.01)
(52) U.S. Cl.
CPC ................ *H04L 25/03057* (2013.01); *H04L 2025/03636* (2013.01)

(58) Field of Classification Search
CPC ..... H04L 25/03057; H04L 2025/03636; H04L 7/0062
(Continued)

(56) References Cited

U.S. PATENT DOCUMENTS

| 8,064,510 | B1 * | 11/2011 | Babanezhad | ............ H04B 3/23 375/232 |
| 9,313,054 | B1 * | 4/2016 | Liao | .................. H04L 25/03019 |

(Continued)

FOREIGN PATENT DOCUMENTS

| CN | 109582596 A | 4/2019 |
| CN | 109920456 A | 6/2019 |

(Continued)

OTHER PUBLICATIONS

International Search Report for PCT/CN2023/081920, mailed on May 17, 2023.

*Primary Examiner* — Leila Malek
(74) *Attorney, Agent, or Firm* — Junhe Law Office P.C.; James J. Zhu

(57) ABSTRACT

A signal processing method for a memory system interface circuit includes: pre-processing a received signal to obtain an input signal; removing a weighted feedback signal from the input signal to obtain an output signal; deciding on the output signal based on a predetermined base signal to generate a digital output signal; generating an interference digital output signal associated with a crosstalk aggressor link; weighting, on a scale of a filter coefficient matrix of the FIR filter, the interference digital output signal to obtain the weighted feedback signal; comparing the output signal with a reference signal to generate an error signal; and determining a set of optimal filter coefficients of the filter coefficient matrix of the FIR filter according to correlation between the interference digital output signal and the error signal, and determining the reference signal according to correlation (Continued)

between the digital output signal and the error signal, to at least partially reduce inter-symbol interference of the received signal introduced by the transmission characteristics of the crosstalk aggressor link.

29 Claims, 3 Drawing Sheets

(58) Field of Classification Search
USPC .......................................................... 375/233
See application file for complete search history.

(56) References Cited

U.S. PATENT DOCUMENTS

| | | | |
|---|---|---|---|
| 2007/0014378 A1* | 1/2007 | Parhi | H04B 3/32 |
| | | | 375/267 |
| 2009/0285271 A1* | 11/2009 | Perez De Aranda Alonso | ............ |
| | | | H04L 27/26134 |
| | | | 375/296 |
| 2010/0177816 A1* | 7/2010 | Malipatil | H04L 25/03343 |
| | | | 375/232 |
| 2015/0124912 A1* | 5/2015 | Eliaz | H04L 1/005 |
| | | | 375/343 |
| 2022/0005512 A1 | 1/2022 | Leslie et al. | |

FOREIGN PATENT DOCUMENTS

| | | |
|---|---|---|
| CN | 111916123 A | 11/2020 |
| WO | 2022039945 A1 | 2/2022 |

\* cited by examiner

SIGNAL PROCESSING METHOD AND DEVICE FOR A MEMORY SYSTEM INTERFACE CIRCUIT

TECHNICAL FIELD

The present application generally relates to signal processing technology, and more particularly, to a signal processing method and device for a memory system interface circuit.

BACKGROUND OF THE INVENTION

With the increased requirement on the performance of data storage in computer systems, the frequency at which signal links in memory systems perform data access operations becomes higher and higher. In existing double data rate (DDR) memory systems, single-ended signals are transmitted in parallel with each other, and thus it is inevitable that significant signal crosstalk may be generated, affecting the signal transmission. The signal crosstalk is for example crosstalk between different lines or between vertical structures such as vias. On the other hand, multi-drop transmission in the systems may result in mismatch in impedance, which may further cause significant reflections of the crosstalk signals and inter-symbol interference due to the crosstalk. Therefore, margins of eye diagrams at receivers are reduced due to the far-end crosstalk for command/address signals and data signals that are transmitted in the signal links of memory systems.

General continuous time crosstalk cancellation (CTCX) technology and adaptive CTCX technology are used to cancel crosstalk's influence on the timing margins by implementing derivative compensation for victim signals by aggressor signals (i.e., the source of crosstalk) in circuits. However, the derivative cancellation circuits need additional hardware and power overheads. In addition, the effect of the CTXC circuits is limited for DDR memory systems having significant crosstalk reflections and long tails.

It is being considered to improve the crosstalk issue in CPU packages for existing DDR memory systems, and to use a special tabbed routing technology in printed circuit boards to reduce crosstalk. However, there is no special means of reducing signal crosstalk at the receivers.

Therefore, there is a need for an improved signal processing method and mechanism for memory systems.

SUMMARY OF THE INVENTION

An objective of the present application is to provide a signal processing method for a memory system interface circuit, which can improve signal integrity.

According to an aspect of the present application, a signal processing method for a memory system interface circuit is provided. The memory system interface circuit comprises at least two signal pins each being configured to receive a transmission signal via an individual signal link and to generate a received signal at a receiver of the signal link. The signal processing method comprises: pre-processing a received signal generated at a receiver of a target signal link for a target signal pin, to obtain an input signal, wherein the target signal pin is one of the at least two signal pins; removing a weighted feedback signal from the input signal to obtain an output signal, wherein the weighted feedback signal is provided by a finite impulse response (FIR) filter in a feedback path; deciding on the output signal based on a predetermined base signal to generate a digital output signal; generating an interference digital output signal associated with a crosstalk aggressor link, wherein the crosstalk aggressor link is a signal link adjacent to the target signal link and corresponds to another of the at least two signal pins, and transmission characteristics of the crosstalk aggressor link interferes with the target signal link and generates inter-symbol interference (ISI) in the received signal; weighting, on a scale of a filter coefficient matrix of the FIR filter, the interference digital output signal to obtain the weighted feedback signal; comparing the output signal with a reference signal to generate an error signal; and determining a set of optimal filter coefficients of the filter coefficient matrix of the FIR filter according to correlation between the interference digital output signal and the error signal, and determining the reference signal according to correlation between the digital output signal and the error signal, to at least partially reduce inter-symbol interference of the received signal introduced by the transmission characteristics of the crosstalk aggressor link.

In another aspect of the present application, a signal processing device for a memory system interface circuit is provided. The memory system interface circuit comprises at least two signal pins each being configured to receive a transmission signal via an individual signal link and to generate a received signal at a receiver of the signal link, and wherein for a target signal pin of the at least two signal pins, the signal processing device comprises: a pre-processing module configured for pre-processing a received signal generated at a receiver of a target signal link of the target signal pin to obtain an input signal; a decision feedback equalizer (DFE) comprising an output path coupled with an output sampler and a feedback path coupled with a finite impulse response (FIR) filter; the DFE being configured for removing a weighted feedback signal from the input signal to obtain an output signal, and the output sampler being configured for deciding on the output signal based on a predetermined base signal to generate a digital output signal; wherein the weighted feedback signal is obtained by weighting on a scale of a filter coefficient matrix of the FIR filter an interference digital output signal; wherein the crosstalk aggressor link is a signal link adjacent to the target signal link and corresponds to another of the at least two signal pins, and transmission characteristics of the crosstalk aggressor link interferes with the target signal link and generates inter-symbol interference (ISI) in the received signal; an error sampler configured for comparing the output signal with a reference signal to generate an error signal; and an adaptive processing module configured for determining a set of optimal filter coefficients of the filter coefficient matrix of the FIR filter according to correlation between the interference digital output signal and the error signal, and determining the reference signal according to correlation between the digital output signal and the error signal, to at least partially reduce inter-symbol interference (ISI) of the received signal introduced by transmission characteristics of the crosstalk aggressor link.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

Figure 1:
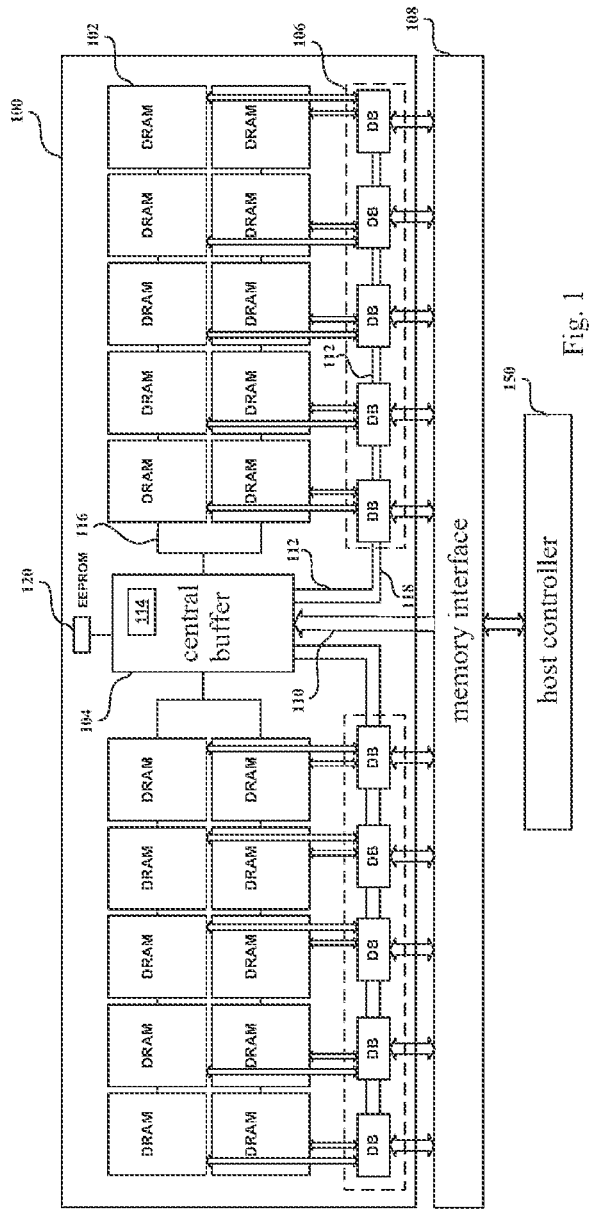
FIG. 1 illustrates a memory system according to an embodiment of the present application.

FIG. 1 illustrates a memory system 100 according to an embodiment of the present application. In some embodiments, the memory system 100 may be a memory system that conforms to the JEDEC double data rate synchronous dynamic random access memory (SDRAM) standard, such as JEDEC DDR, DDR2, DDR3, DDR4, DDR5, and other double data rate standards. In addition, the memory system 100 may also be an internal memory that conforms to other standards or protocols, such as RAMBUS internal memory, or may be a memory that conforms to future memory standards or protocols.

As shown in FIG. 1, the memory system 100 includes a plurality of memory modules 102 (exemplarily illustrated as DRAM in the figure), wherein each memory module 102 includes a plurality of memory cells which are arranged in an array. In some embodiments, the memory module may include a volatile memory (such as dynamic random access memory), non-volatile memory (flash memory, such as NAND or NOR flash memory), or a combination of both volatile and non-volatile memories. In other embodiments, the memory module may also be a new type of memory manufactured using different processes, including but not limited to: magnetoresistive memory, phase-change memory, resistive memory, semi-floating gate memory, or any other type of memory. It should be noted that the memory module described herein may be a single memory chip, or may include two or more memory chips. In the memory system 100 shown in FIG. 1, a plurality of memory modules 102 are arranged into two groups of memory modules, and each group of memory modules constitutes a memory rank of the memory system 100 to store data.

The memory system 100 also includes a central buffer 104 and a data buffer (DB) 106. In some embodiments, the central buffer 104 may be a registering clock driver (RCD). Specifically, the central buffer 104 is coupled to a host controller 150 and receives access commands each including a target address and an access type via the memory interface 108. The access command may be a control command to access (such as, to read or to write) one or more target addresses in the memory module 102. The data buffer 106 is further coupled to a host controller 150 via a memory interface 108, to receive an access command and/or data to be written into the memory system 100 from the host controller 150, or send data read from the memory system 100 to the host controller 150. In some embodiments, the central buffer 104 receives an access command via the command/address (C/A) bus 110. The central buffer 104 is also coupled to each memory module 102 via a memory control bus 116 to control these memory modules 102 to write or to read data via the data buffer 106.

The data buffer 106 is coupled between the memory module 102 and the memory interface 108 to exchange data therebetween. For example, the data stored in the memory module 102 can be read out and sent to the memory interface 108 via the data buffer 106, or the data received from the memory interface 108 via the data buffer 106 can be written into the corresponding memory cell(s) in the memory module. The data buffer 106 includes a plurality of submodules (for example, 10 submodules shown in the embodiment in FIG. 1), and each submodule is coupled to the corresponding two memory modules 102. The data buffer 106 including a plurality of submodules arranged in parallel can increase a data access bandwidth of the memory system 100. It can be understood that the present application does not limit the amount of submodules of the data buffer 106.

The memory interface 108 has a plurality of signal pins. A portion of the signal pins are coupled to the central buffer 104, and another portion of the signal pins are coupled to the data buffers 106. It can be appreciated that high-frequency (e.g., 1600 MHZ, 2666 MHZ, 3200 MHZ or even higher) digital signals may be transmitted on these signal pins, and signals received at different signal pins may interfere with each other during signal transmission. For example, a signal link for a signal pin may include some wiring and interconnect structures in metal layers, which may be adjacent to the wiring and/or interconnect structures of signal links for other signal pins. Thus, the signal link for the signal pin may be interfered by the adjacent signal links, resulting in inter-symbol interference (ISI) in the signals transmitted by the signal link. The ISI in signals between adjacent signal links needs to be removed using specific signal processing technologies.

According to an aspect of the present application, a signal processing method is provided, which can be used in an interface circuit of a memory system, such as an interface circuit of a memory controller. For example, the signal processing method may be used in the memory interface 108 of the central buffer 104 and/or the data buffers 106. As aforementioned, each of the signal pins included in the memory interface may receive a transmission signal provided by an external controller (e.g., the host controller 150 shown in FIG. 1) via an individual signal link (i.e., an amount of the signal links may be equal to that of the signal pins), and may generate a received signal at the receiver of the signal link. In addition, the signal processing method may be used in other interface circuits in the memory system, such as an interface circuit for the memory module 102, which is a signal link between the data buffer 106 and the memory module 102, or used in the interface circuit 112 between the data buffer 106 and the central buffer 104 and the interface circuit 116 between the central buffer 104 and the memory module 102. It can be appreciated that although the processing of the signal processing method of the present application is exemplarily described with reference to a memory system, the signal processing method can be used in interface circuits of various other types of circuits such as SERDES circuits.

Figure 2:
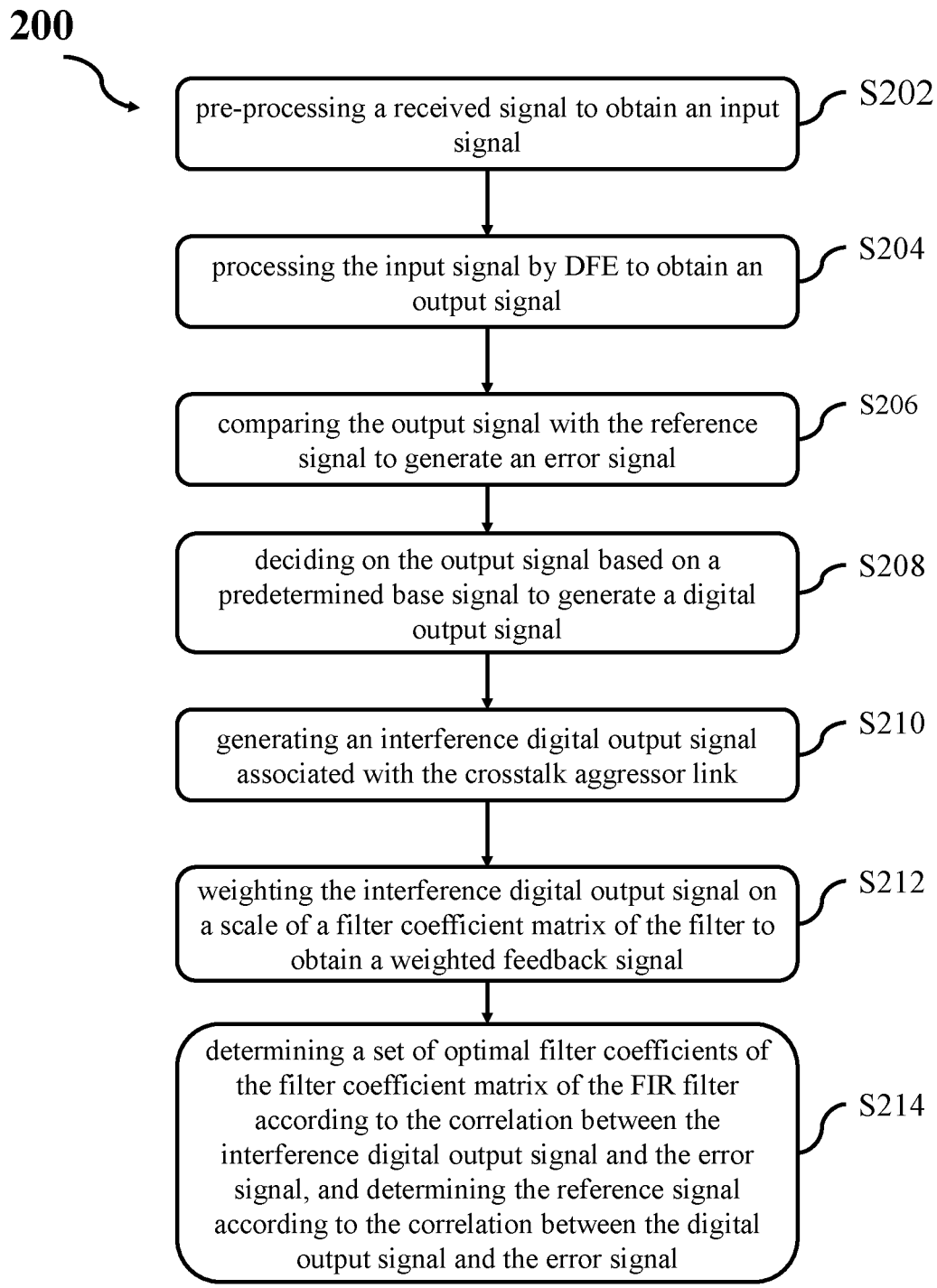
FIG. 2 illustrates a signal processing method for a memory system interface circuit according to an embodiment of the present application.
Figure 3:
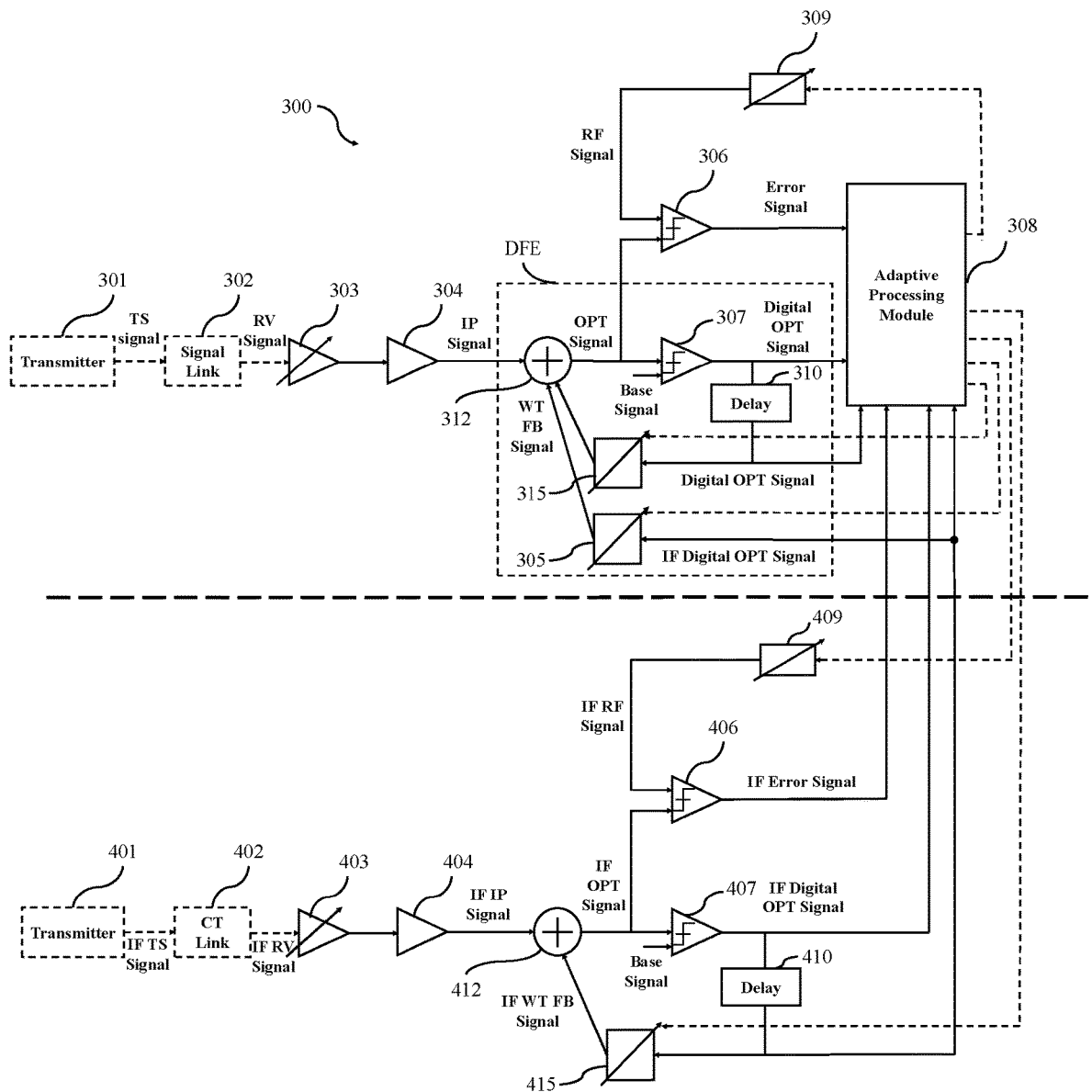
FIG. 3 illustrates a signal processing device for a memory system interface circuit according to an embodiment of the present application.

FIG. 2 illustrates a signal processing method 200 for a memory system interface circuit according to an embodiment of the present application, and FIG. 3 illustrates a signal processing device 300 for a memory system interface circuit according to an embodiment of the present application, which can be used to implement the signal processing method 200 shown in FIG. 2. In some embodiments, the signal processing device 300 may be, for example, integrated within a corresponding interface circuit, such as an interface circuit of a memory controller. It can be appreciated that since at least two signal pins may be included in an interface circuit, each of the signal pins may have an individual signal processing device 300. Preferably, some modules of the signal processing devices 300 for the respective signal pins may be integrated together.

In the following, the signal processing method and device of the present application will be elaborated with reference to the embodiments shown in FIGS. 2 and 3.

As shown in FIGS. 2 and 3, a transmission signal from a transmitter 301 (e.g., the host controller 150 shown in FIG. 1) may be transmitted via a signal transmission link 302 to a receiver of a signal pin of an interface circuit. FIG. 3 also illustrates that an interference transmission signal is transmitted from another transmitter 401 to a receiver of another signal pin in the interface circuit via a crosstalk aggressor link 402. Due to that the links are close to each other, the crosstalk link 402 may interfere with the signal transmission on the signal link 302, and may generate inter-symbol interference (ISI) in the received signal at the receiver of the signal link 302. It should be noted that although the crosstalk aggressor link 402 is illustrated in FIG. 3 as a signal link of the same type as the signal link 302, it can be any other signal links that may interfere with the signal link 302. Furthermore, in other examples, the transmitter 401 and the transmitter 301 may be the same party, for example, both are a host controller. In some examples, the signal pin corresponding to the signal link 302 may be one of the command/address pins, while the signal pin corresponding to the crosstalk aggressor link 402 may be another command/address pin, and thus these signal pins may together transmit a portion of the symbols of the command/address signal at the same frequency in the meantime. It can be appreciated that, if there is no special processing, the ISI introduced by the crosstalk aggressor link may deteriorate the received signal received at the receiver of the signal link 302, which is disadvantageous to a circuit system working at a high frequency. It should be noted that the crosstalk aggressor link 402 and the signal link 302 may interfere with each other due to their adjacency.

Specifically, the signal processing method 200 begins at step S202. The received signal received at the receiver is pre-processed to obtain an input signal. Optionally, the pre-processing may not include any special processing to ISI in signals, which can be addressed in a later step. In some embodiments of the present application, the pre-processing performed in step S202 may include continuous time linear equalization by a continuous time linear equalizer (CTLE) 303, and variable gain adjustment by a variable gain amplifier (VGA) 304 such as signal amplification and so on. Optionally, only the aforementioned continuous time linear equalization or the variable gain adjustment processing may be performed in step S202. It can be appreciated that other types of pre-processing may also be performed in step S202 of the signal processing method 200, depending on actual requirements. The signal generated after the one or more types of pre-processing to the received signal may be used as the input signal for a decision feedback equalizer (DFE).

Next, in step S204, the input signal is processed by the DFE to obtain an output signal. Specifically, the DFE may remove a weighted feedback signal from the input signal. More details of the weighted feedback signal will be elaborated below. As shown in FIG. 3, the DFE includes a filter 305 and an adder 312. The filter 305 has a filter coefficient matrix which is coupled in a feedback path of the DFE and further coupled to the adder 312. In some embodiments, the DFE may include multiple stages. Each stage may feed back to the adder 312 an interference digital output signal received from a signal processing circuit of another signal pin using a configurable filter coefficient (will be elaborated below). Therefore, the adder 312 may remove the feedback signals from the input signal. In this way, interferences (especially ISI introduced by the signal links of the other signal pins) in the output signal can be processed, and thus the ISI in the input signal can be at least partially removed. In practical applications, the filter 305 may be a finite impulse response (FIR) filter, which can generate the output signal that is equal to or close to a target signal by adjusting one or more filter coefficients of the filter coefficient matrix. As will be described below in more details, each filter coefficient of the filter coefficient matrix of the filter 305 may be adjusted according to an interference digital output signal that is previously decoded and the correlation between the interference digital output signal and an error signal, and the adjusting process can be performed in a pre-calibration process of the DFE.

In step 206, the output signal is provided to an error sampler 306 and compared with a reference signal received by the error sampler 306 to generate the error signal. In some embodiments, the reference signal is obtained by performing an averaging operation or other similar statistical operation on an analog voltage of symbol "1" in the output signal outputted by the adder 312. Therefore, the reference signal may change with the analog voltage of symbol "1" in the received signal. It is expected that the reference signal may converge to a constant value or fluctuate within a range. In some embodiments, it may be determined whether or not to update the reference signal according to values of the digital output signal and the error signal at a current time moment.

In step 208, the output signal is also provided to an output sampler 307, and decided by the output sampler 307 according to a predetermined base signal to generate the digital output signal. Still referring to FIG. 3, the output sampler 307 is coupled in an output path of the DFE, and the output signal of the adder 312 may be received and processed by the output sampler 307. In some embodiments, the output sampler 307 may be a 1-bit quantizer. In some embodiments, the output sampler 307 receives the predetermined base signal (which may be a base signal with a fixed voltage level), and compares the output signal with the predetermined base signal to make a decision such as "0" or "1" on the output signal. It can be appreciated that in some other embodiments the output sampler 307 may be a multi-bit quantizer which may be implemented as an analog to digital converter. The decision result by the output sampler 307 may be a digital signal, which is referred to as the digital output signal in the context of the present application. In other words, the output sampler 307 converts the output signal in an analog signal format into the digital output signal in a digital signal format. Accordingly, the predetermined base signal may be a reference voltage level that is in compliance with the memory system. The signals processed and generated by the error sampler 306 and the output sampler 307 are both digital signals, which may be provided to an adaptive processing module 308 for further processing.

With the signal processing method, crosstalk aggressor link's influence can be cancelled in the post-stage signal processing circuit of the signal link 302. Specifically, in step S210, the interference transmission signal can be received by the crosstalk aggressor link 402 that interferes with the signal link and further processed by the post-stage signal processing circuit to obtain the interference digital output signal. The obtained interference digital output signal can be used as a source for deriving the crosstalk signal, which can be cancelled in the subsequent steps. Specifically, the adder 312 may receive the weighted feedback signal from the filter 305 and remove such signal from the input signal.

As described above, step S210 is used to generate the weighted feedback signal used in step S204. In some embodiments of the present application, the post-stage processing used in the crosstalk aggressor link in step S210 can be similar to the processing by the post-stage circuit of the signal link. In case that the crosstalk aggressor link 402 implements the same function as the signal link 302, other modules of the crosstalk aggressor link 402 may be configured the same as those of the signal link 302. For example, the CTLE processing may be performed by a CTLE module 403, the variable gain adjustment processing may be performed by a VGA module 404, and a corresponding interference weighted feedback signal can be removed by the adder 412. The interference weighted feedback signal may be generated based on the interference digital output signal after being delayed by a delay module 410 and being weighted by a filter coefficient matrix of a filter 415. The filter 415 may use an architecture similar as the filter 305, and its filter coefficients may be updated based on the interference digital output signal and the interference error signal using the LMS algorithm or the SS-LMS algorithm, which is similar as the coefficient updating of the filter 305. The post-stage circuit of the crosstalk aggressor link 402 may include an error sampler 406 and a digital-to-analog converter 409, which may generate the interference error signal and determine the interference reference signal in a manner similar as the error sampler 306 and the digital-to-analog converter 409. Similarly, the interference reference signal may be updated based on the interference digital output signal and the interference error signal using the LMS algorithm or the SS-LMS algorithm.

In step S212, the filter coefficient matrix of the filter weights the interference digital output signal to generate the weighted feedback signal. The weighted feedback signal is provided to the adder 312 for the filter processing to the input signal. Specifically, the filter 305 may receive the interference digital output signal, and weight the delayed interference digital output signal using a set of filter coefficients. In some embodiments, the delay module 310 may include multiple delay submodules, and the filter coefficient matrix also includes multiple stages as respective feedback sub-paths, each of which may receive a respective interference digital output signal (from the crosstalk aggressor link) and feed it back to the adder 312. In some embodiments, each feedback sub-path may include a delay submodule, and each delay submodule may delay the received interference digital output signal by one or more cycles, and thus the adjacent bits of the interference digital output signal may be provided to the filter coefficient matrix together.

It can be appreciated that each stage of the multi-stage filter coefficient matrix may be coupled to a signal processing circuit of another signal pin to receive a signal provided by the circuit, or two or more stages of the multi-stage filter coefficient matrix may be coupled to the signal processing circuit of another signal pin to receive the signal provided by the circuit (in that case, the two or more stages may have different delays). In practical applications, how the filter 305 is coupled to the other signal pins may depend on the interference to the signal in the signal link 302 by the respective signal links of the signal pins, which may be determined by a modeling and simulation result or may be determined based on actual measurement results. In some embodiments, a circuit coupling switching module may be provided to selectively couple the interference digital output signals of the one or more other signal pins to the filter 305. As such, all or a portion of the interference digital output signals may be selectively received according to actual requirements to at least partially remove the corresponding ISI. Additionally, it can be appreciated that the signal link of a signal pin may be interfered with by the signal links (as crosstalk aggressor links) of other signal pin, while the other signal links may be interfered with by the signal link of the signal pin as a crosstalk pin. In other words, the signal interference are mutual.

Next, in step S214, the adaptive processing module 308 may determine the reference signal according to correlation between the digital output signal provided by the output sampler 307 and the error signal provided by the error sampler 306, and determine a set of optimal filter coefficients of the filter coefficient matrix according to correlation between the error signal and the interference digital output signal provided by the delay module 410. In some embodiments, the adaptive processing module 308 may be implemented as a FPGA device or other signal processing device, which can perform a specific adaptive processing algorithm by loading in a specific program/codes.

In the embodiment shown in FIG. 3, multiple "loops" where the adaptive processing module 308 is located is illustrated. Two adaptive loops are used to process the ISI introduced by crosstalk aggressor links including an upper "loop" and a lower "loop". The upper "loop" involving the adaptive processing module 308 includes the error sampler 306, the adaptive processing module 308 and the digital to analog converter 309, and may update the reference signal after several times/cycles of computation. The digital to analog converter 309 is used to convert the digital signal outputted by the adaptive processing module 308 in a digital signal format into the reference signal in an analog signal format. On the other hand, the lower "loop" involving the adaptive processing module 308 includes the error sampler 306, the output sampler 407 and the delay module 410 in the crosstalk aggressor link post-stage circuit, the adaptive processing module 308 and the filter 305, which may update multiple filter coefficients of the filter coefficient matrix of the filter 305 according to the interference digital output signal and the error signal in the post-stage circuit of the target signal link after several times/cycles of computation. Specifically, the adaptive processing module 308 may determine whether or not to perform the update according to the correlation between the interference digital output signal and the error signal, and determine the updating direction and step of the filter coefficients of the filter coefficient matrix and/or the reference signal if needed. In this way, it is expected that the filter coefficients and the reference signal can converge to the optimal values after multiple times of update. When the set of optimal coefficients are configured, the ISI in the received signal at the receiver of the signal link 302 introduced by the inherent transmission characteristics of the crosstalk aggressor link can be at least partially cancelled. The "correlation" between signals used herein may be any types of applicable mathematical relations, and a computation result of the mathematical relation can characterize or measure an extent of "correlation" between the interference output signal or the digital output signal, and the error signal. The specific manner to describe the correlation is not limited by the present application, as long as it can qualitatively or quantitatively describe the extent of correlation between the interference output signal or the digital output signal.

In some embodiments of the present application, the step S214 of determining the reference signal according to the correlation between the digital output signal and the error signal can be implemented in the following manner: determining whether to update the reference signal according to values of the digital output signal and the error signal at a current time moment, and updating the reference signal at a predetermined reference step according to an indication to update the reference signal (i.e., it is determined to update the reference signal). In contrast, if it is determined that there is no need to update the reference signal according to the values of the digital output signal and the error signal at the current time moment, then the reference signal can maintain at a certain value. In some conditions, if the reference signal maintains at a certain value or substantially does not change within several cycles, then it can be determined that the reference signal has converged to a certain value. The predetermined reference step generally defines a minimum resolution to increase or decrease the reference signal. A smaller reference step can help the reference signal converge to a certain value more precisely, with a longer convergence time. Therefore, there is a tradeoff between the convergence accuracy and the convergence time when determining the value of the predetermined reference step, and preferably both can be satisfied to some extent. In some embodiments of the present application, updating the reference signal at the predetermined reference step can be implemented by determining the reference signal through a least mean square (LMS) algorithm or a sign-sign least mean square (SS-LMS) algorithm according to the digital output signal and the error signal. It can be appreciated that other applicable adaptive processing algorithms may be used in the embodiments of the present application, which is known to a person skilled in the art and thus will not be elaborated.

In some embodiments of the present application, the adaptive processing module 308 may use the LMS algorithm or the SS-LMS algorithm. accordingly, in step S214, for the LMS algorithm, the reference signal may be updated using the following equation (1).

$$dLev_{n+1} = dLev_n + u_{dLev} * e_n * d_{n\_vict} \quad (1)$$

wherein $dLev_{n+1}$ is an updated reference signal at the current time moment, $dLev_n$ is the reference signal before updating at the current time moment, $u_{dLev}$ is the predetermined reference step, $d_{n\_vict}$ is a value of the digital output signal at the current time moment. For example, if $dLev_n=8.2$, $u_{dLev}=0.2$, $e_n=0.2$, and $d_{n\_vict}=1$, then the updated reference signal $dLev_{n+1}=8.2+0.2*0.2*1=8.24$.

Similarly, for the SS-LMS algorithm, the reference signal may be updated using the following equation (2)

$$dLev_{n+1} = dLev_n + u_{dLev} * \text{sign}(e_n) * \text{sign}(d_{n_{vict}}) \quad (2)$$

wherein $dLev_{n+1}$ is an updated reference signal at the current time moment, $dLev_n$ is the reference signal before updating at the current time moment, $u_{dLev}$ is the predetermined reference step, $e_n$ is a value of the error signal at the current time moment, $d_{n\_vict}$ is a value of the digital output signal at the current time moment, and sign( ) refers to a mathematical sign function. It can be defined that sign(1)=1 and sign(0)=−1. For example, if $dLev_n=8.2$, $u_{dLev}=0.2$, $e_n=0.2$, and $d_{n\_vict}=1$, then the updated reference signal $dLev_{n+1}=8.2+0.2*1*1=8.4$.

In some embodiments of the present application, if the FIR filter includes m stages, and m is a positive integer, then step S214 of determining the set of optimal filter coefficients of the filter coefficient matrix according to the correlation between the interference digital output signal and the error signal further includes the following steps: determining whether or not to update a filter coefficient of a $k^{th}$ stage of the FIR filter according to a value of the error signal at a current time moment and a value of the interference digital output signal at k time intervals prior to the current time moment, wherein k is a positive integer smaller than or equal to m; and updating the filter coefficients of the $k^{th}$ stage at a predetermined filter step according to the indication to update the filter coefficients of the $k^{th}$ stage. For example, if the filter includes 6 stages, then whether or not to update the filter coefficient of the second stage of the filter 305 may be based on the sign of the error signal at the current time moment and the signs of the interference digital output signal at two previous time intervals before the current time moment. In some embodiments of the present application, updating the filter coefficient of the $k^{th}$ stage at the predetermined filter step may include determining the filter coefficient of the $k^{th}$ stage according to the interference digital output signal and the error signal using the LMS algorithm or the SS-LMS algorithm.

In some embodiments of the present application, the adaptive processing module 308 may use the LMS algorithm, and accordingly, the filter coefficients may be updated in step S214 using the following equation:

$$w[k]_{n+1} = w[k]_n + u_{dfe} * e_n * d_{(n-k)\_aggr} \quad (3)$$

wherein $w[k]_{n+1}$ is an updated filter coefficient of the $k^{th}$ stage at the current time moment, $w[k]_n$ is the filter coefficient of the $k^{th}$ stage before updating at the current time moment, $u_{dfe}$ is the predetermined filter step, $e_n$ is a value of the error signal at the current time moment, and $d_{(n-k)\_aggr}$ is a value of the interference digital output signal at k time intervals prior to the current time moment. For example, if $w[3]_n=1$, $u_{dfe}=-0.1$, $e_n=0.2$ and $d_{(n-3)\_aggr}=1$, then the updated filter coefficient of the third stage $w[3]_{n+1}=1+(-0.1)*0.2*1=0.98$.

In some embodiments of the present application, the adaptive processing module 308 may use the SS-LMS algorithm, and accordingly, the filter coefficients may be updated in step S214 using the following equation:

$$w[k]_{n+1} = w[k]_n + u_{dfe} * \text{sign}(e_n) * \text{sign}(d_{(n-k)\_aggr}) \quad (2)$$

wherein $w[k]_{n+1}$ is an updated filter coefficient of the $k^{th}$ stage at the current time moment, $w[k]_n$ is the filter coefficient of the $k^{th}$ stage before updating at the current time moment, $u_{dfe}$ is the predetermined filter step, $e_n$ is a value of the error signal at the current time moment, $d_{(n-k)\_aggr}$ is a value of the interference digital output signal at k time intervals prior to the current time moment, and sign( ) refers to a mathematical sign function. For example, if $w[3]_n=1$ $u_{df}=-0.1$, $e_n=0.2$ and $d_{(n-3)\_aggr}=1$, then the updated filter coefficient of the third stage $w[3]_{n+1}=1+(-0.1)*1+1=0.9$.

In some examples, the signal processing method and device of the present application can be used in a memory system. Accordingly, the updating of the filter coefficients and the reference signal as described above may be performed at an initialization stage of the memory system. After a period of computation, the filter coefficients and the reference signal may adaptively converge to respective stable values, which may have a change less than 5% or even less than 2% between two adjacent cycles, for example. It can be appreciated that a predetermined threshold of the change such as 2% or less may be provided as a criterion for convergence. If the coefficients or the signal has a change between two adjacent cycles that is less than the predetermined threshold value, then it may be determined that the calibration is completed. In that case, a set of optimal filter coefficients and the corresponding reference signal value may be obtained, which may reflect the filter performance of the adaptive filter required to compensate for or reduce the interference to the transmission signal by the signal in the crosstalk aggressor link 402. It should be noted that in the context of the present application, the optimal filter coefficients and the reference signal can reduce the ISI effectively, but it does not mean that the ISI can be reduced to zero, and does not mean that the ISI can be reduced uniformly for all the signal pins. For example, the more cycles of updating of the adaptive filter coefficients and the reference signal, the better of the reduction of the ISI is, but such operation may increase the pre-calibration time of the coefficients and the reference time.

It can be appreciated that, since the interference to a signal link due to the inherent transmission characteristics of the crosstalk aggressor link is generally stable, it is not desired to adjust or calibrate the filter coefficients and the reference signal frequently during the operation of a memory system.

In some embodiments of the present application, the transmission signal or interference transmission signal sent from the transmitter may be a random signal such as a Pseudo Random Binary Sequence (PRBS). Since the random signal can simulate various data combinations as many as possible, the transmission characteristics of the signal link can be more accurately characterized using such random signal instead of specifically configured signals. Accordingly, the resulting filter coefficients of the filter coefficient matrix of the filter can be more accurate.

In some embodiments of the present application, the signal processing method 200 shown in FIG. 2 may further include re-determining the filter coefficients of the filter according to the randomly generated transmission signal and interference transmission signal at a predetermined interval. Since the interference to the signal link 302 by the crosstalk aggressor link 402 shown in FIG. 3 may still change in a long-term period due to the variation of temperature and other external conditions, it is preferred to update the filter coefficients after a long-term use. Accordingly, the steps S202 to S214 may be repeated at a predetermined interval, to maintain the resulting filter coefficients of the filter fit for the changing transmission characteristics of the crosstalk aggressor link, and to optimize the margin of eye diagrams as much as possible.

In some embodiments of the present application, the crosstalk aggressor link may have multiple links, and the interference transmission signal may include signals transmitted over each of the crosstalk aggressor links. For example, the crosstalk aggressor link adjacent to a signal link may include two crosstalk aggressor links which transmits two respective interference transmission signals from two other sending parties. The two crosstalk aggressor links may be in the form similar to the crosstalk aggressor link shown in FIG. 3, and may generate respective interference digital output signals. Furthermore, the two interference digital output signals may be provided to the filter 305, and may generate together the weighted feedback signals after being weighted by respective filter coefficients. The weighted feedback signals may be provided to the adder as feedback to compensate from the ISI introduced into the transmission signal in the signal link 302 by the two crosstalk aggressor links.

In some optional embodiments, besides using the adaptive filter to suppress the ISI introduced into the signal in each signal link by its adjacent signal links, the post-stage processing circuit of the signal link can suppress the ISI in its signal which is introduced by itself in a similar manner. For example, a delay module 310 may be provided to feed back the digital output signal to the additional filter 315, and a delay module 410 may be provided to feed back the interference digital output signal to the filter 415. Accordingly, the LMS algorithm or the SS-LMS algorithm or any other proper adaptive filter algorithm may be used to determine the respective filter coefficients and the reference signal (interference reference signal).

Another aspect of the present application provides a computer-readable storage medium, in which instructions are stored. When the instructions are executed by the processor, the processor is configured to execute any of the signal processing methods. The computer-readable medium referred to in this application include various types of computer storage medium, which can be any available medium that can be accessed by a general-purpose or special-purpose computer. For example, computer-readable medium may include RAM, ROM, EPROM, E2PROM, registers, hard disks, removable disks, CD-ROM or other optical disk memory, disk memory or other magnetic storage devices, or any other temporary or non-temporary medium which can be used to carry or store desired program code units in the form of instructions or data structures, and which can be accessed by a general-purpose or special-purpose computer, or a general-purpose or special-purpose processor. For example, the disk used in this application usually copies data magnetically, while the disk uses laser to copy data optically. The above combination should also be included in the protection scope of computer-readable medium. The exemplary storage medium is coupled to the processor such that the processor can read and write information from/to the storage medium. Alternatively, the storage medium can be integrated into the processor. The processor and storage medium can reside in the ASIC. ASIC can reside in the user terminal. Alternatively, the processor and storage medium can reside in the user terminal as discrete components.

To sum up, the signal processing method and device for a memory system interface circuit provided by the embodiments of the present application use an improved DFE algorithm which can reduce the mutual interference between signal links of different signal pins and can reduce the calibration time for DFE optimized filter coefficients from several seconds to several milliseconds, which significantly reduces the calibration time for the DFE during the initialization. Furthermore, since the calibration time for DFEs can be reduced significantly, the circuit system can be calibrated at a predetermined interval according to actual requirements, to adjust the filter coefficients substantially in real time and effectively to compensate a drift due to the variation of temperature or voltage.

It should be noted that although several steps or modules of a signal processing method and device for a memory system interface circuit have been described in the previous paragraphs, such division is exemplary and not mandatory. Practically, according to the embodiments of the present disclosure, the functions and features of two or more modules described above may be embodied in one module. On the other hand, the functions and features of any one module described above may be embodied in two or more modules.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A signal processing method for a memory system interface circuit, wherein the memory system interface circuit comprises at least two signal pins each being configured to receive a transmission signal via an individual signal link and to generate a received signal at a receiver of the signal link, and wherein the signal processing method comprises:
   pre-processing a received signal generated at a receiver of a target signal link for a target signal pin, to obtain an input signal, wherein the target signal pin is one of the at least two signal pins;
   removing a weighted feedback signal from the input signal to obtain an output signal, wherein the weighted feedback signal is provided by a finite impulse response (FIR) filter in a feedback path;
   deciding on the output signal based on a predetermined base signal to generate a digital output signal;
   generating an interference digital output signal associated with a crosstalk aggressor link, wherein the crosstalk aggressor link is a signal link adjacent to the target signal link and corresponds to another of the at least two signal pins, and transmission characteristics of the crosstalk aggressor link interferes with the target signal link and generates inter-symbol interference (ISI) in the received signal;
   weighting, on a scale of a filter coefficient matrix of the FIR filter, the interference digital output signal to obtain the weighted feedback signal;
   comparing the output signal with a reference signal to generate an error signal; and
   determining a set of optimal filter coefficients of the filter coefficient matrix of the FIR filter according to correlation between the interference digital output signal and the error signal, and determining the reference signal according to correlation between the digital output signal and the error signal, to at least partially reduce inter-symbol interference of the received signal introduced by the transmission characteristics of the crosstalk aggressor link.

2. The method of claim 1, wherein the pre-processing further comprises continuous time linear equalization, variable gain adjustment or the combination thereof.

3. The method of claim 1, wherein determining the reference signal according to correlation between the digital output signal and the error signal further comprises:
   determining whether to update the reference signal according to values of the digital output signal and the error signal at a current time moment; and
   updating the reference signal at a predetermined reference step according to an indication to update the reference signal.

4. The method of claim 3, wherein updating the reference signal at a predetermined reference step further comprises:
   determining the reference signal using least mean square algorithm or sign-sign least mean square algorithm according to the digital output signal and the error signal.

5. The method of claim 4, wherein determining the reference signal using least mean square algorithm further comprises updating the reference signal using the following equation:

$$dLev_{n+1} = dLev_n + u_{dLev} * e_n * d_{n\_vict}$$

wherein $dLev_{n+1}$ is an updated reference signal at the current time moment, $dLev_n$ is the reference signal before updating at the current time moment, $u_{dLev}$ is a predetermined reference step, $e_n$ is a value of the error signal at the current time moment, and $d_{n\_vict}$ is a value of the digital output signal at the current time moment.

6. The method of claim 4, wherein determining the reference signal using sign-sign least mean square algorithm further comprises updating the reference signal using the following equation:

$$dLev_{n+1} = dLev_n + u_{dLev} * \text{sign}(e_n) * \text{sign}(d_{n\_vict})$$

wherein $dLev_{n+1}$ is an updated reference signal at the current time moment, $dLev_n$ is the reference signal before updating at the current time moment, $u_{dLev}$ is a predetermined reference step, $e_n$ is a value of the error signal at the current time moment, $d_{n\_vict}$ is a value of the digital output signal at the current time moment, and sign( ) refers to a mathematical sign function.

7. The method of claim 1, wherein the FIR filter comprises m stages, and m is a positive integer, and wherein determining a set of optimal filter coefficients of the filter coefficient matrix of the FIR filter according to correlation between the interference digital output signal and the error signal further comprises:

determining whether or not to update a filter coefficient of a $k^{th}$ stage of the FIR filter according to a value of the error signal at a current time moment and a value of the interference digital output signal at k time intervals prior to the current time moment, wherein k is a positive integer smaller than or equal to m; and updating the filter coefficient of the $k^{th}$ stage at a predetermined filter step according to an indication to update the filter coefficient of the $k^{th}$ stage.

8. The method of claim 7, wherein updating the filter coefficient of the $k^{th}$ stage at a predetermined filter step further comprises:

determining the filter coefficient of the $k^{th}$ stage using least mean square algorithm or sign-sign least mean square algorithm according to the interference digital output signal and the error signal.

9. The method of claim 8, wherein determining the filter coefficient of the $k^{th}$ stage using least mean square algorithm further comprises updating the filter coefficient using the following equation:

$$w[k]_{n+1} = w[k]_n + u_{dfe} * e_n * d_{(n-k)\_aggr}$$

wherein $w[k]_{n+1}$ is an updated filter coefficient of the $k^{th}$ stage at the current time moment, $w[k]_n$ is the filter coefficient of the $k^{th}$ stage before updating at the current time moment, $u_{dfe}$ is the predetermined filter step, $e_n$ is a value of the error signal at the current time moment, $d_{(n-k)\_aggr}$ is a value of the interference digital output signal at k time intervals prior to the current time moment.

10. The method of claim 8, wherein determining the filter coefficient of the $k^{th}$ stage using sign-sign least mean square algorithm further comprises updating the filter coefficient using the following equation:

$$w[k]_{n+1} = w[k]_n + u_{dfe} * \text{sign}(e_n) * \text{sign}(d_{(n-k)\_aggr})$$

wherein $w[k]_{n+1}$ is an updated filter coefficient of the $k^{th}$ stage at the current time moment, $w[k]_n$ is the filter coefficient of the $k^{th}$ stage before updating at the current time moment, $u_{dfe}$ is the predetermined filter step, $e_n$ is a value of the error signal at the current time moment, $d_{(n-k)\_aggr}$ is a value of the interference digital output signal at k time intervals prior to the current time moment, and sign( ) refers to a mathematical sign function.

11. The method of claim 1, wherein the transmission signal is a randomly generated signal or a pseudo random sequence.

12. The method of claim 1, wherein the method is repeated at a predetermined interval to re-determine the set of optimal filter coefficients of the filter coefficient matrix of the FIR filter and the reference signal.

13. The method of claim 1, wherein the memory system interface circuit is integrated in a memory interface of a memory controller.

14. The method of claim 1, wherein the memory system interface circuit is integrated in an interface of a memory module.

15. The method of claim 1, wherein generating an interference digital output signal associated with a crosstalk aggressor link comprises:

receiving an interference transmission signal by the crosstalk aggressor link and generating an interference received signal at a receiver of the crosstalk aggressor link;

pre-processing the interference received signal to obtain an interference input signal;

removing the weighted feedback signal from the interference input signal to obtain an interference output signal; and deciding on the interference output signal based on the predetermined base signal to generate the interference digital output signal.

16. The method of claim 15, wherein the interference transmission signal and the transmission signal are two parallel signals of a same type.

17. A signal processing device for a memory system interface circuit, wherein the memory system interface circuit comprises at least two signal pins each being configured to receive a transmission signal via an individual signal link and to generate a received signal at a receiver of the signal link, and wherein for a target signal pin of the at least two signal pins, the signal processing device comprises:

a pre-processing module configured for pre-processing a received signal generated at a receiver of a target signal link of the target signal pin to obtain an input signal;

a decision feedback equalizer (DFE) comprising an output path coupled with an output sampler and a feedback path coupled with a finite impulse response (FIR) filter; the DFE being configured for removing a weighted feedback signal from the input signal to obtain an output signal, and the output sampler being configured for deciding on the output signal based on a predetermined base signal to generate a digital output signal; wherein the weighted feedback signal is obtained by weighting, on a scale of a filter coefficient matrix of the FIR filter, an interference digital output signal associated with a crosstalk aggressor link, wherein the crosstalk aggressor link is a signal link adjacent to the target signal link and corresponds to another of the at least two signal pins, and transmission characteristics of the crosstalk aggressor link interferes with the target signal link and generates inter-symbol interference (ISI) in the received signal;

an error sampler configured for comparing the output signal with a reference signal to generate an error signal; and an adaptive processing module configured for determining a set of optimal filter coefficients of the filter coefficient matrix of the FIR filter according to correlation between the interference digital output signal and the error signal, and determining the reference signal according to correlation between the digital output signal and the error signal, to at least partially reduce inter-symbol interference (ISI) of the received signal introduced by transmission characteristics of the crosstalk aggressor link.

18. The signal processing device of claim 17, wherein the adaptive processing module is further configured to update the reference signal using least mean square algorithm as defined by the following equation:

$$dLev_{n+1} = dLev_n + u_{dLev} * e_n * d_{n\_vict}$$

wherein dLev$_{n+1}$ is an updated reference signal at the current time moment, dLev$_n$ is the reference signal before updating at the current time moment, u$_{dLev}$ is a predetermined reference step, e$_n$ is a value of the error signal at the current time moment, and d$_{n\_vict}$ is a value of the digital output signal at the current time moment.

19. The signal processing device of claim 17, wherein the adaptive processing module is further configured to update the reference signal using sign-sign least mean square algorithm as defined by the following equation:

$$dLev_{n+1} = dLev_n + u_{dLev} * \text{sign}(e_n) * \text{sign}(d_{n\_vict})$$

wherein dLev$_{n+1}$ is an updated reference signal at the current time moment, dLev$_n$ is the reference signal before updating at the current time moment, u$_{dLev}$ is a predetermined reference step, e$_n$ is a value of the error signal at the current time moment, d$_{n\_vict}$ is a value of the digital output signal at the current time moment, and sign( ) refers to a mathematical sign function.

20. The signal processing device of claim 17, wherein the FIR filter comprises m stages, and m is a positive integer, and the adaptive processing module is further configured to determine the filter coefficient using least mean square algorithm as defined by the following equation:

$$w[k]_{n+1} = w[k]_n + u_{dfe} * e_n * d_{(n-k)\_aggr}$$

wherein w[k]$_{n+1}$ is an updated filter coefficient of a k$^{th}$ stage at the current time moment, w[k]$_n$ is the filter coefficient of the k$^{th}$ stage before updating at the current time moment, u$_{dfe}$ is the predetermined filter step, e$_n$ is a value of the error signal at the current time moment, d$_{(n-k)\_aggr}$ is a value of the interference digital output signal at k time intervals prior to the current time moment.

21. The signal processing device of claim 17, wherein the FIR filter comprises m stages, and m is a positive integer, and the adaptive processing module is further configured to determine the filter coefficient using sign-sign least mean square algorithm as defined by the following equation:

$$w[k]_{n+1} = w[k]_n + u_{dfe} * \text{sign}(e_n) * \text{sign}(d_{(n-k)\_aggr})$$

wherein w[k]$_{n+1}$ is an updated filter coefficient of the k$^{th}$ stage at the current time moment, w[k]$_n$ is the filter coefficient of the k$^{th}$ stage before updating at the current time moment, u$_{dfe}$ is the predetermined filter step, e$_n$ is a value of the error signal at the current time moment, d$_{(n-k)\_aggr}$ is a value of the interference digital output signal at k time intervals prior to the current time moment, and sign( ) refers to a mathematical sign function.

22. The signal processing device of claim 17, wherein the transmission signal is a randomly generated signal or a pseudo random sequence.

23. The signal processing device of claim 22, wherein the transmission signal is a pseudo random sequence generated by a circulating shift register.

24. The signal processing device of claim 22, wherein the adaptive processing module is configured to re-determine the filter coefficients of the FIR filter at a predetermined interval according to the transmission signal that is randomly generated.

25. The signal processing device of claim 17, wherein the interference digital output signal is generated using the following steps:
receiving an interference transmission signal by the crosstalk aggressor link and generating an interference received signal at a receiver of the crosstalk aggressor link;
pre-processing the interference received signal to obtain an interference input signal;
removing the weighted feedback signal from the interference input signal to obtain an interference output signal; and
deciding on the interference output signal based on the predetermined base signal to generate the interference digital output signal.

26. The signal processing device of claim 25, wherein the interference transmission signal and the transmission signal are two parallel signals of a same type.

27. A memory controller comprising the signal processing device of claim 17.

28. The memory controller of claim 27, wherein the memory controller is a register clock driver or a data buffer.

29. A memory module comprising the signal processing device of claim 17.

* * * * *